(12) United States Patent
Stowell

(10) Patent No.: US 8,382,900 B2
(45) Date of Patent: Feb. 26, 2013

(54) LOCALIZED LINEAR MICROWAVE SOURCE ARRAY PUMPING TO CONTROL LOCALIZED PARTIAL PRESSURE IN FLAT AND 3 DIMENSIONAL PECVD COATINGS

(75) Inventor: Michael W. Stowell, Loveland, CO (US)

(73) Assignee: Applied Materials, Inc., Santa Clara, CA (US)

( * ) Notice: Subject to any disclaimer, the term of this patent is extended or adjusted under 35 U.S.C. 154(b) by 842 days.

(21) Appl. No.: 12/527,281

(22) PCT Filed: Feb. 15, 2007

(86) PCT No.: PCT/US2007/062206
§ 371 (c)(1),
(2), (4) Date: Aug. 14, 2009

(87) PCT Pub. No.: WO2008/100315
PCT Pub. Date: Aug. 21, 2008

(65) Prior Publication Data
US 2010/0075033 A1    Mar. 25, 2010

(51) Int. Cl.
*C23C 16/00* (2006.01)
(52) U.S. Cl. .................. 118/715; 118/716; 118/718
(58) Field of Classification Search .................. None
See application file for complete search history.

(56) References Cited

U.S. PATENT DOCUMENTS 6,177,142 B1    1/2001    Felts
6,287,990 B1    9/2001    Cheung et al.

OTHER PUBLICATIONS

International Search Report and Written Opinion, Application No. PCT/US07/62206, Oct. 1, 2007 (1 page).

*Primary Examiner* — Robert Xu
(74) *Attorney, Agent, or Firm* — Cooley LLP

(57) ABSTRACT

A system and method for controlling deposition of thin films on substrates. One embodiment includes a vacuum chamber; a plurality of sources located inside the vacuum chamber; and a plurality of gas tubes, each of the plurality of gas tubes comprising a first volume for delivering precursor gas and a second volume for providing pumping.

10 Claims, 11 Drawing Sheets

LOCALIZED LINEAR MICROWAVE SOURCE ARRAY PUMPING TO CONTROL LOCALIZED PARTIAL PRESSURE IN FLAT AND 3 DIMENSIONAL PECVD COATINGS

RELATED APPLICATIONS

This application is related to commonly owned and assigned international application no. [not yet assigned], entitled "System and Method for Chemical Vapor Deposition Process Control", filed simultaneously herewith and incorporated by reference.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates to systems and methods for managing vapor deposition processes and for depositing thin films on substrates.

BACKGROUND OF THE INVENTION

Chemical vapor deposition processes (CVD) are used to deposit non-conductive and conductive films on a variety of substrates. The chemical CVD process has been enhanced by the use of plasma. This process is referred to as plasma enhanced chemical vapor deposition (PECVD). This PECVD process is commonly used in industrial applications.

PECVD systems are typically driven by high power supplies including microwave, high frequency, very high frequency and radio frequency power supplies. The characteristics of thin films produced by a PECVD process vary substantially and can be controlled by varying the power supply type, the power supply output, carrier gas flow rates, precursor gas flow rates, partial pressure of gases, and substrate pre-conditioning. By varying these parameters, films of different chemistries and thicknesses can be created.

Typical PECVD systems include a plurality of sources, also referred to as antennae, anode or cathose typically fixed in a plane. Each of these antennae are connected to a power supply and emit electromagnetic radiation or create electromagnetic fields producing electrons that are used to generate a plasma in the PECVD process. These antennae are typically arranged in a single plane and are used to deposit thin films on flat substrates. This planar array of antennas tends to result in a homogenous film and an even thickness for smaller substrates.

Unfortunately, this planar antennae array tends to be ineffective for curved substrates and large planar substrates. For example, current PECVD systems have difficulty in controlling gas pressure and gas flows around the edges of large substrates. This control difficulty results in uneven concentrations of carrier gas and precursor gas across the substrate surface—with lower concentrations near the edges. For example, typical PECVD systems pump excess gas and waste materials away from the substrate surface. Typically, this waste gas is pumped from behind the substrate—meaning that the flow of waste gas travels along the surface of the substrate and around the edges. For large substrates the gas concentrates at these edges and can dramatically change the film properties and deposition rates at the edges. Accordingly, a system and method are needed to better control PECVD processes and produce more uniform films.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the particular forms described in this Summary of the Invention or in the Detailed Description. One skilled in the art can recognize that there are numerous modifications, equivalents and alternative constructions that fall within the spirit and scope of the invention as expressed in the claims.

A system and method for controlling deposition of thin films on substrates is disclosed. A system and method for controlling deposition of thin films on substrates. One embodiment includes a vacuum chamber; a plurality of sources located inside the vacuum chamber; and a plurality of gas tubes, each of the plurality of gas tubes comprising a first volume for delivering precursor gas and a second volume for providing pumping.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION OF THE DRAWINGS

Figure 1:
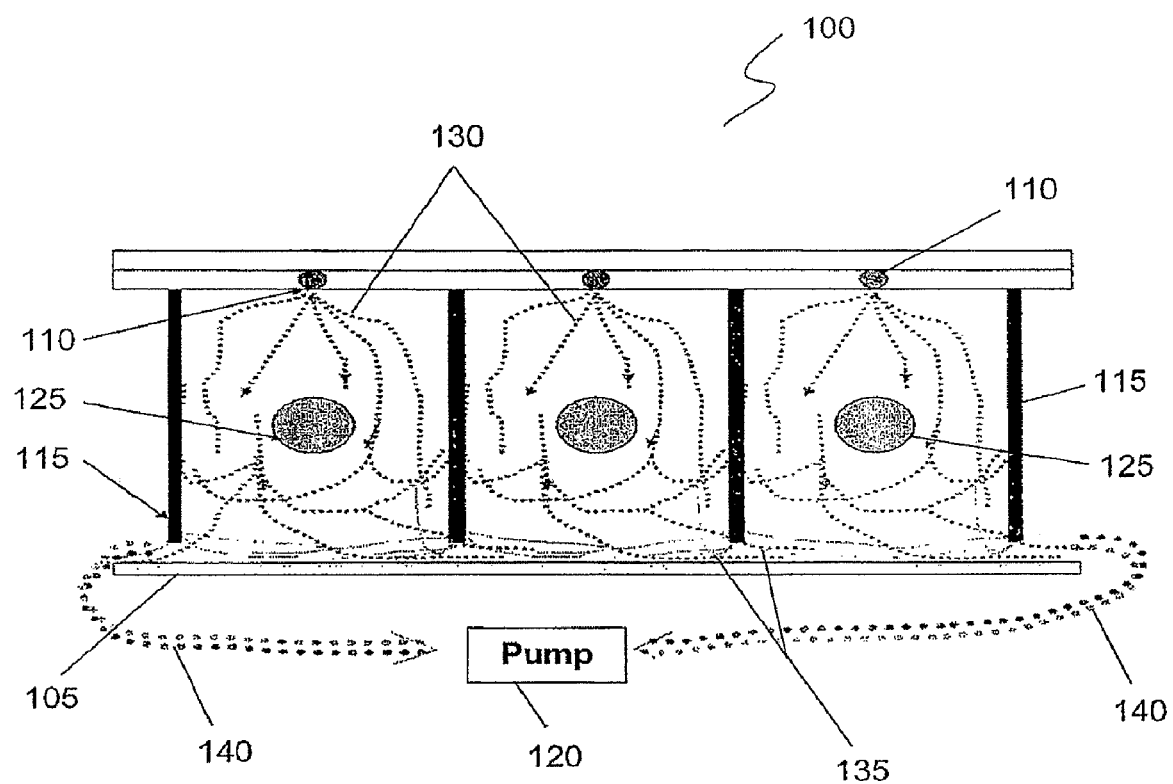
FIG. 1 illustrates a cross section of a PECVD system.

Referring now to the drawings, where like or similar elements are designated with identical reference numerals throughout the several views, and referring in particular to FIG. 1, it illustrates a cross section of a PECVD system 100. This system includes a substrate 105, a carrier gas supply 110, a precursor gas supply 115, a pump 120, and three sources 125. Those skilled in the art understand that this system would also include a power source, a vacuum system, process chamber walls, a vacuum chamber and a substrate carrier. But for clarity, these elements are not illustrated in FIG. 1.

In operation, the substrate 105 is placed inside the vacuum chamber. Power is supplied to the three sources 125. As previously mentioned, this power could be any type of high-energy power supply including RF, HF, VHF, etc. The sources 125, which are typically surrounded by dielectrics such as quartz, creates electrons that collide with carrier gas molecules introduced through the carrier gas supply. These collisions fractionalize the carrier gas molecules, thereby producing radicals and forming a plasma around the sources. The radicals cause a cascade reaction by colliding with other carrier gas molecules, forming even more radicals. These radicals then collide with the precursor gas molecules introduced through the precursor gas supply, thereby causing the precursor gas molecules to fractionalize. Portions of the precursor gas molecules deposit upon the substrate 105. Waste portions of the precursor gas molecules are pumped away from the substrate 105 by the pump 120 located on the back side of the substrate 105. This pump 120 also pumps away excess carrier gas molecules.

The arrows in FIG. 1 show the approximate flow path of the carrier gas, the precursor gas, and the waste gas. For example, flow path 130 illustrates the path that the carrier gas would follow, flow path 135 illustrates the flow path that the precursor gas would follow, and flow path 140 illustrates the path that the pumped off waste gas would follow from the substrate 105 to the pump 120. The concentration of gas, including precursor and carrier gas, is lower near the edges than it is in the center of the substrate.

Figure 2:
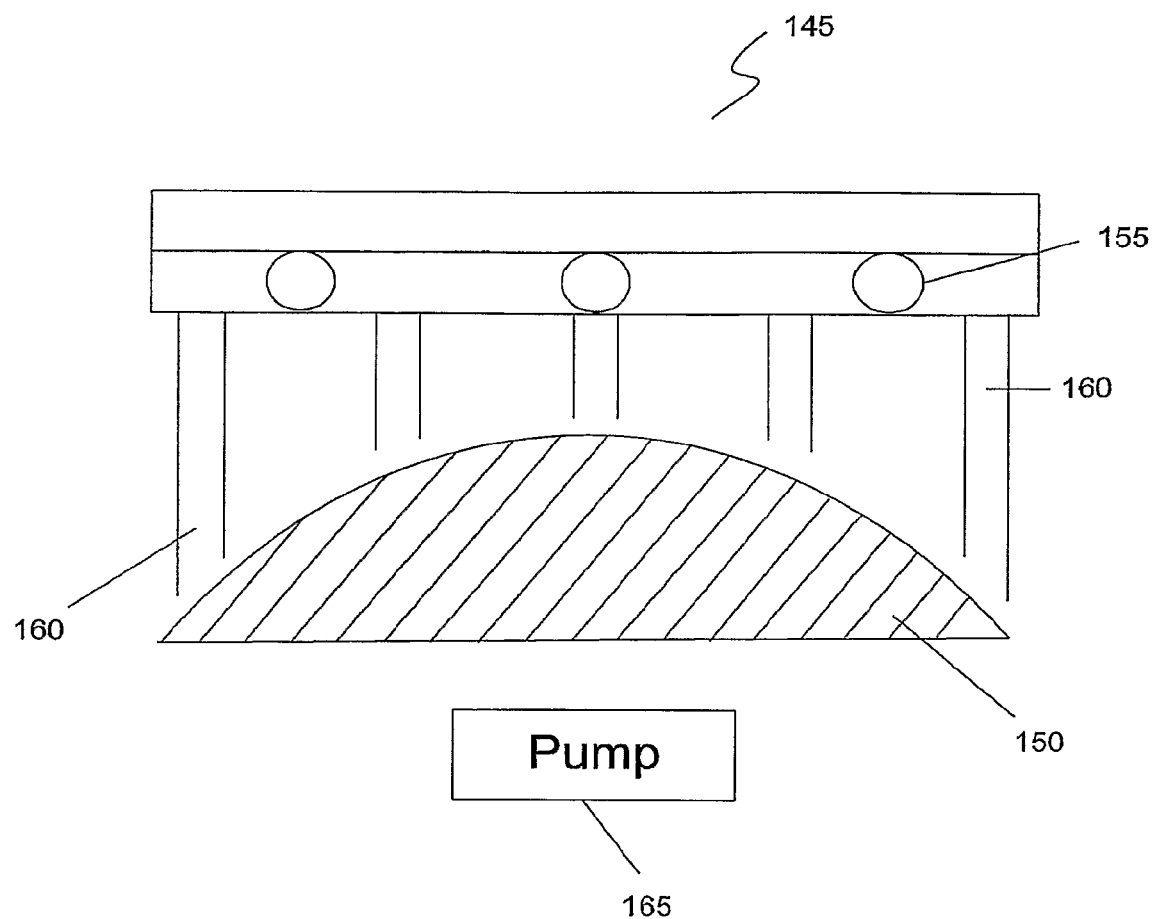
FIG. 2 is a block diagram of a PECVD system for coating a curved substrate.

Referring now to FIG. 2 it is a block diagram of a PECVD system 145 for coating a curved substrate 150. This system includes a curved substrate 150, a carrier gas supply 155, a precursor gas supply 160, and a pump 165 located on the back side of the curved substrate 150.

Curved substrates present particular difficulty for the thin film industry because of the difficulty in depositing a uniform film. This embodiment attempts to compensate for the curved substrate by providing different length precursor gas supplies 160. The goal of the different length supplies is to release precursor gas at a fixed distance from the surface of the substrate. This fixed distance helps promote even film thickness across the substrate. Even with variable length precursor gas supply tubes, this system still suffers from the edge effect caused by backside pumping. That is, the gas flow rate and the gas concentration are lower at the edges of the curved substrate than they are in the center of the substrate. Accordingly, film thickness and chemistry varies at the edges of the substrate.

Figure 3:
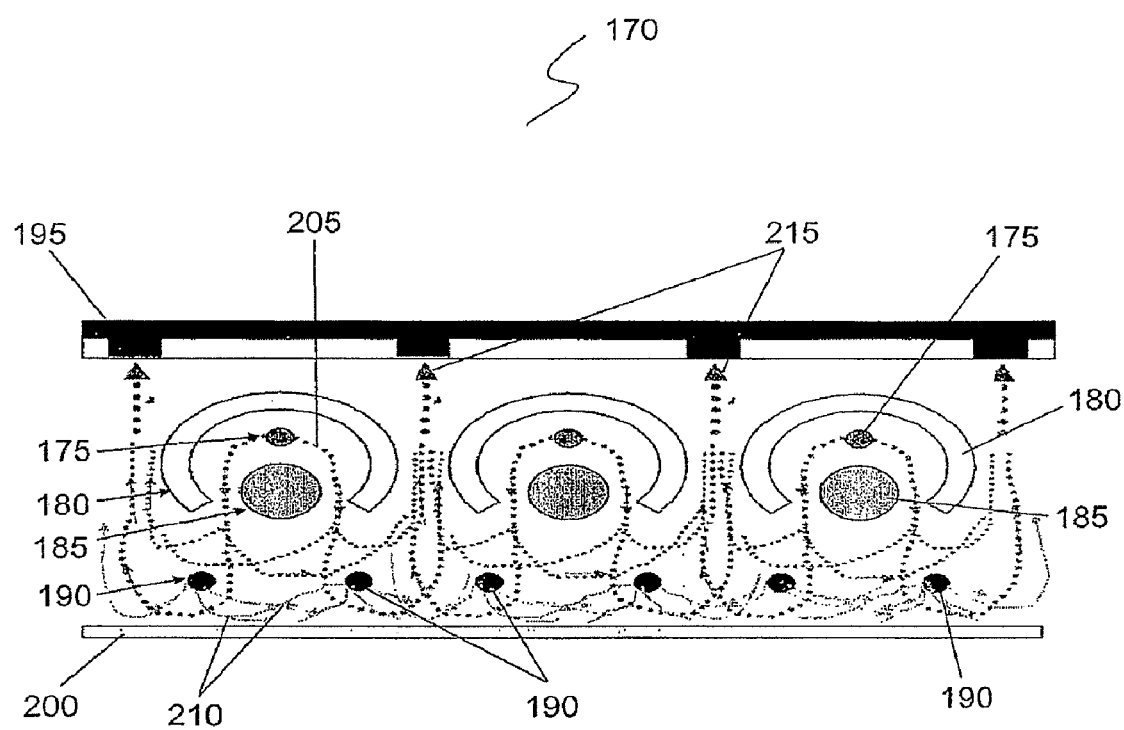
FIG. 3 illustrates a block diagram of a PECVD system designed to minimize edge effects and better control the deposition process.

Referring now to FIG. 3, it illustrates a block diagram of a PECVD system 170 designed to minimize edge effects and better control the deposition process. This system includes a carrier gas source 175, a shield 180, three sources 185, a precursor gas source 190 (one type of gas tube), a pump 195, and a substrate 200.

In this embodiment of the PECVD system, the back side pump is replaced with a pump 195 (and corresponding duct work) that is opposite the substrate surface. For the purpose of this document, this general style of pumping will be referred to as front-side pumping. It can be used independently or in conjunction with back-side pumping.

By using the front-side pumping rather than only back-side pumping, the substrate 200 is effectively divided into localized areas that can be more finely controlled. In this example, edge effects are greatly reduced because pumping is performed relatively near to where the precursor gas is released and where the waste particles are formed.

In this embodiment, the carrier gas supply 175 is located inside the shield 180 that partially surrounds the source 185. By locating the carrier gas supply 175 inside this shield 180, carrier gas concentrations and pressures can be more finely controlled. Moreover, the shield 180 helps to increase the fractionalization percentage of the carrier gas over a system that does not include a shield 180. This component composed of or coated with dielectric materials reduces the recombination of the radicalized species further increasing the available radical for the process.

The flow arrows in FIG. 3 help illustrate the flow paths of the carrier gas, the precursor gas, and the waste gas. Flow arrow 265 illustrates the path that the carrier gas follows from the carrier gas supply to the substrate and then back to the pump. Flow arrow 210 illustrates the path that the precursor gas follows from the precursor gas supply toward the substrate 200 and back toward the pump 195. And finally, flow arrow 215 illustrates the combined waste gas that is being pumped away from the substrate 200 and out of the PECVD chamber.

Figure 4:
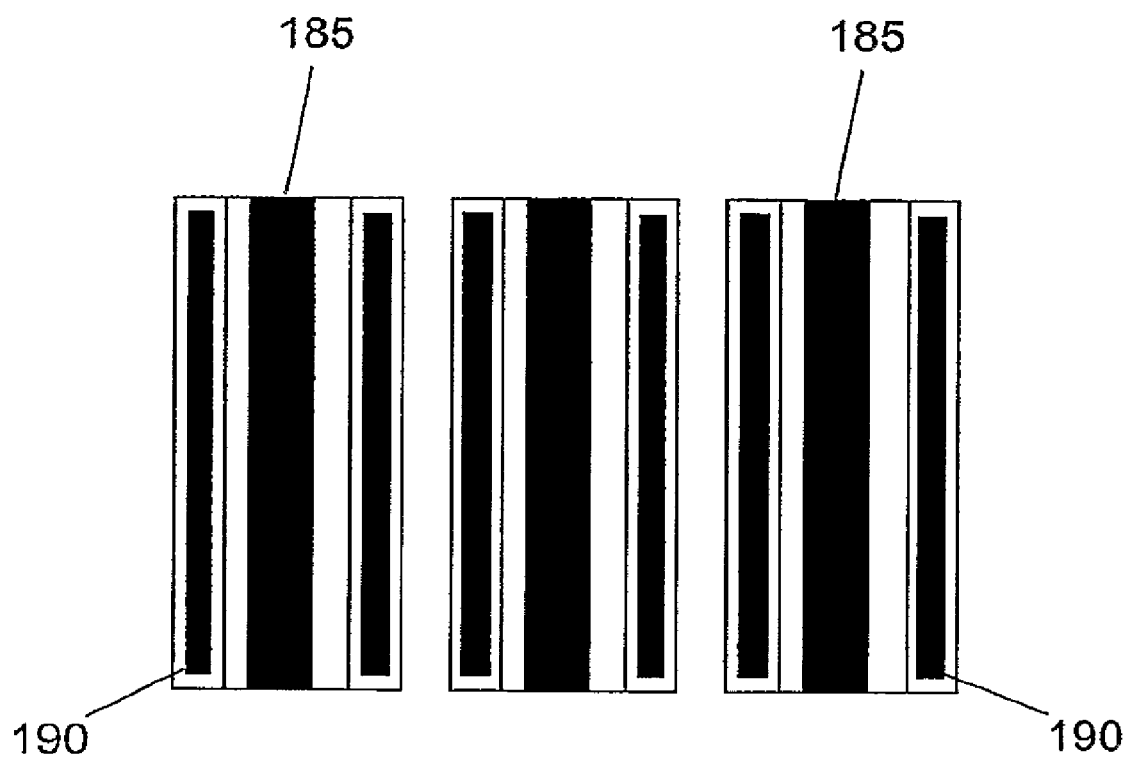
FIG. 4 illustrates a front view of the inside of the PECVD system shown in FIG. 3.

FIG. 4 illustrates a front view of the inside of the PECVD system 170 shown in FIG. 3. This illustration shows that the precursor gas supply 190 runs parallel to the substrate 200 and is roughly the length of the source 185. Only three sources 185 are illustrated, but those skilled in the art will understand that any number of sources and gas supplies can be used.

Figure 5:
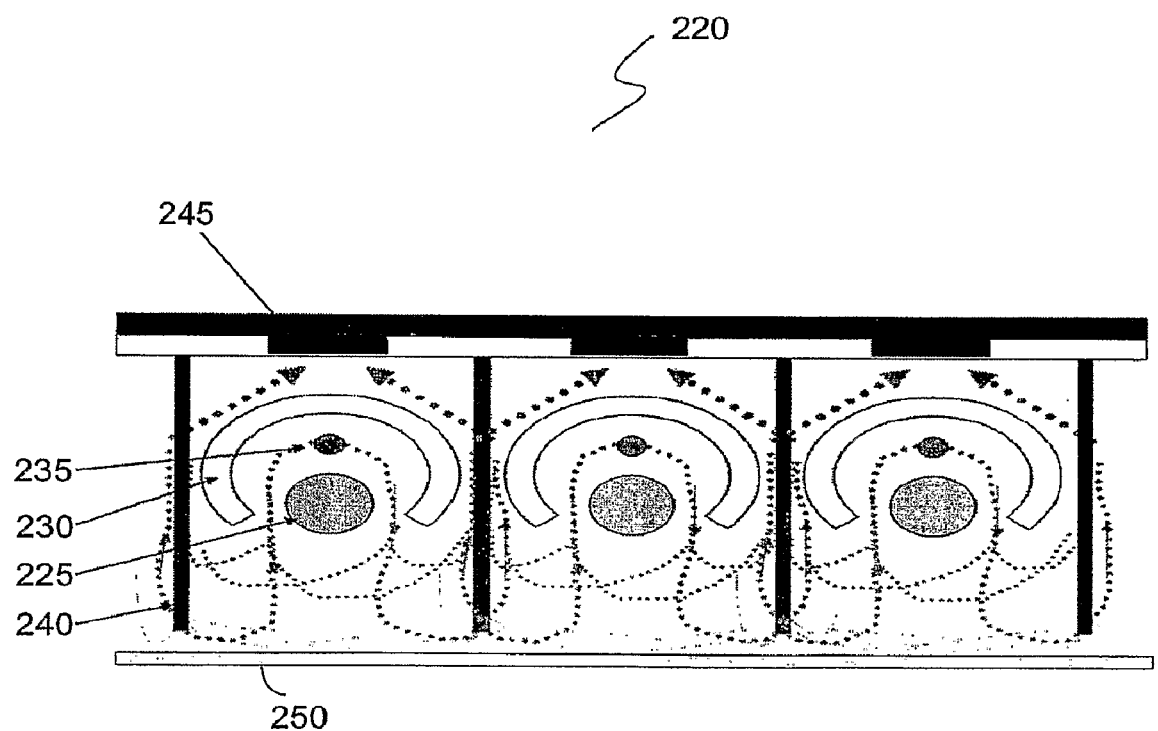
FIG. 5 illustrates another embodiment of a PECVD system.

Referring now to FIG. 5, it illustrates another embodiment of a PECVD system 220. This system includes three sources 225, three shields 230, carrier gas supplies 235, precursor gas supplies 240, a top-side pump 245, and a substrate 250. In this embodiment, the precursor gas supplies 240 are a series of drop tubes rather than a series of linear tubes. These drop tubes, which are one type of gas tube, can provide even more precision in delivering the precursor gas to an area near the substrate surface. This embodiment also includes a different configuration for front-side pumping that is included in the embodiment of FIG. 4.

Figure 6:
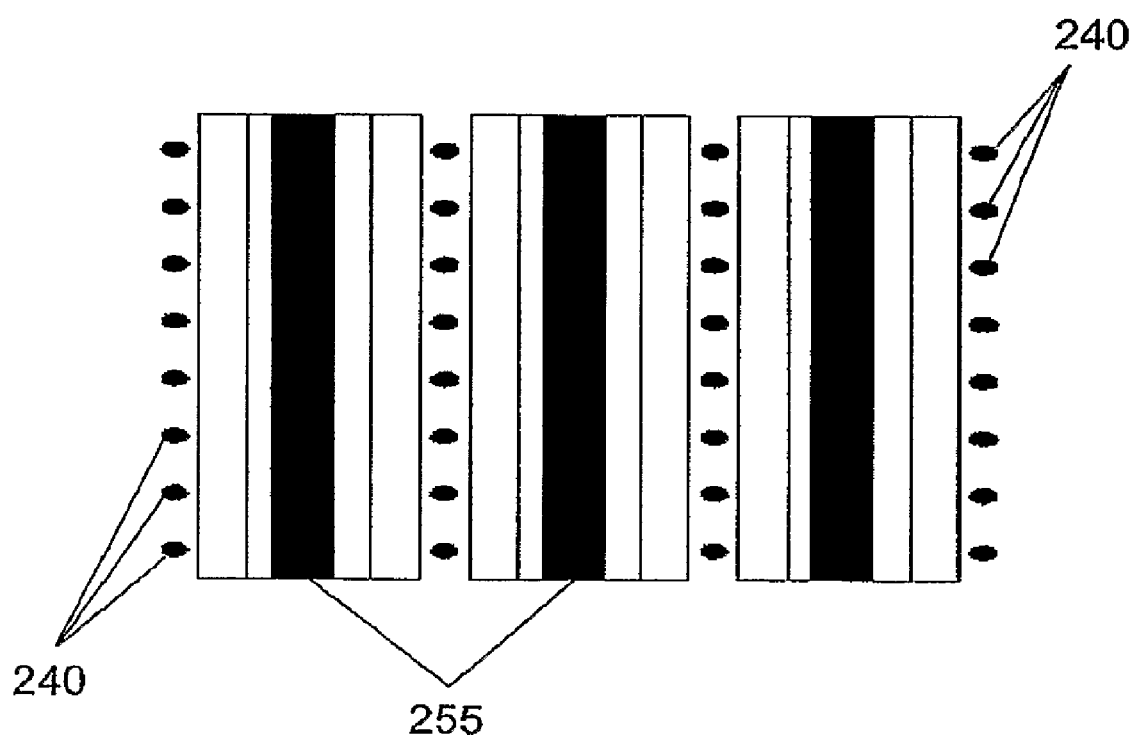
FIG. 6 illustrates a front view of the PECVD system of FIG. 5.

Referring now to FIG. 6, it illustrates a front view of the PECVD system of FIG. 5, in particular, this front view diagram shows that multiple precursor drop tubes 240 would be utilized along the width of the substrate. These tubes are perpendicular to the substrate. In certain embodiments, these drop tubes are coated with a dielectric to minimize recombination, prevent etching by the plasma and to minimize deposition upon the tubes.

Figure 7:
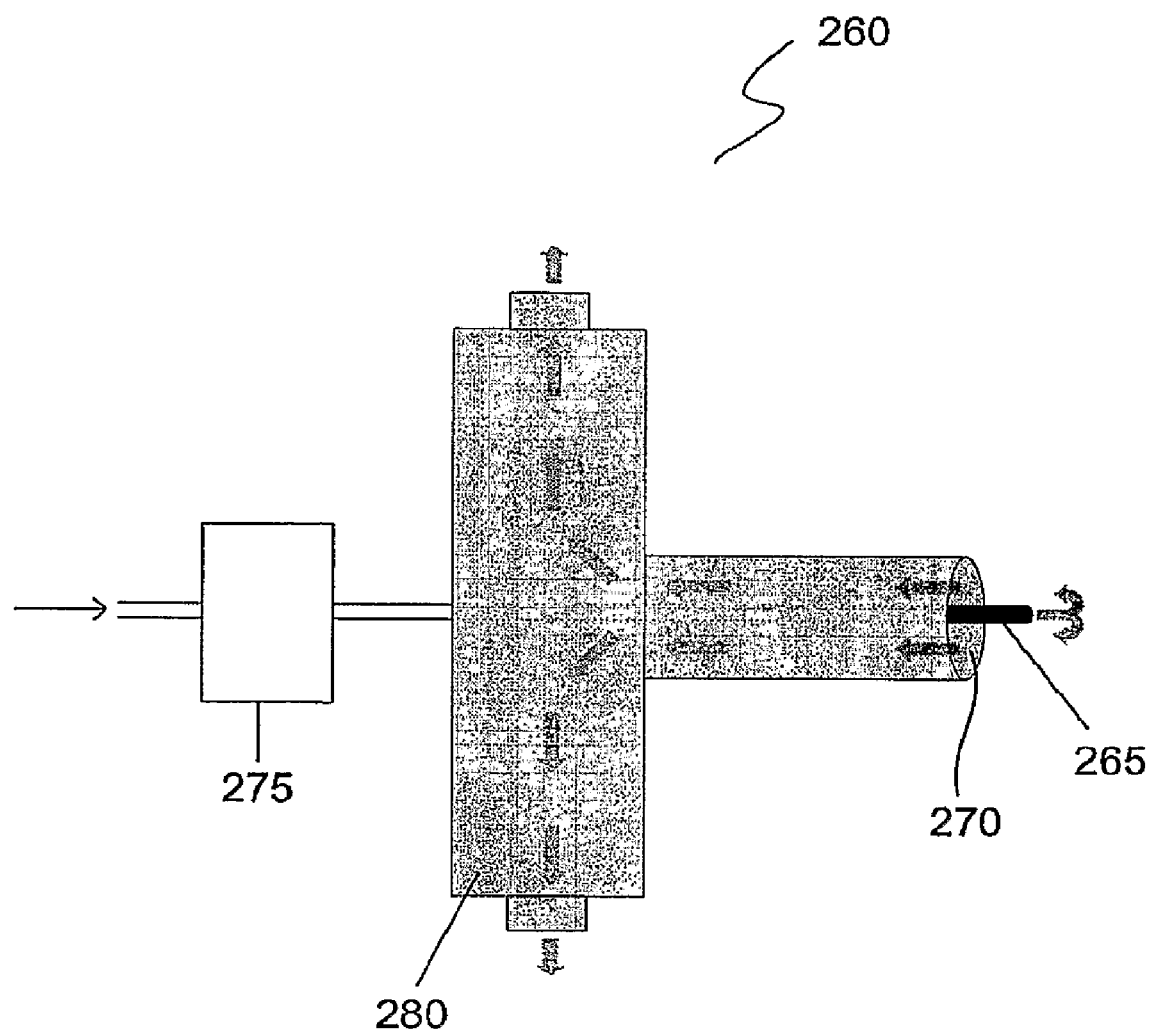
FIG. 7 illustrates one embodiment of a component of a drop tube.

Referring now to FIG. 7, it illustrates one embodiment of a component of a drop tube. In particular, FIG. 7 illustrates a dual-volume drop tube 260 that can be used to deliver precursor gas. This embodiment includes a first volume 265 that delivers the precursor gas to the substrate surface and a second volume 270 that provides pumping to remove waste gas from near the substrate surface. This embodiment also includes a flow regulator 275 that could be manually or computer controlled to vary the flow of precursor gas through the first volume 265. This embodiment further includes a discharge volume 280 to which many tubes can be connected so that the waste gas could be pumped away. The use of this dual-volume drop tube 260 provides highly localized precursor delivery and pumping. By providing such highly localized delivery and pumping, film chemistry and thickness can be precisely controlled for large substrates and curved substrates.

Figure 8:
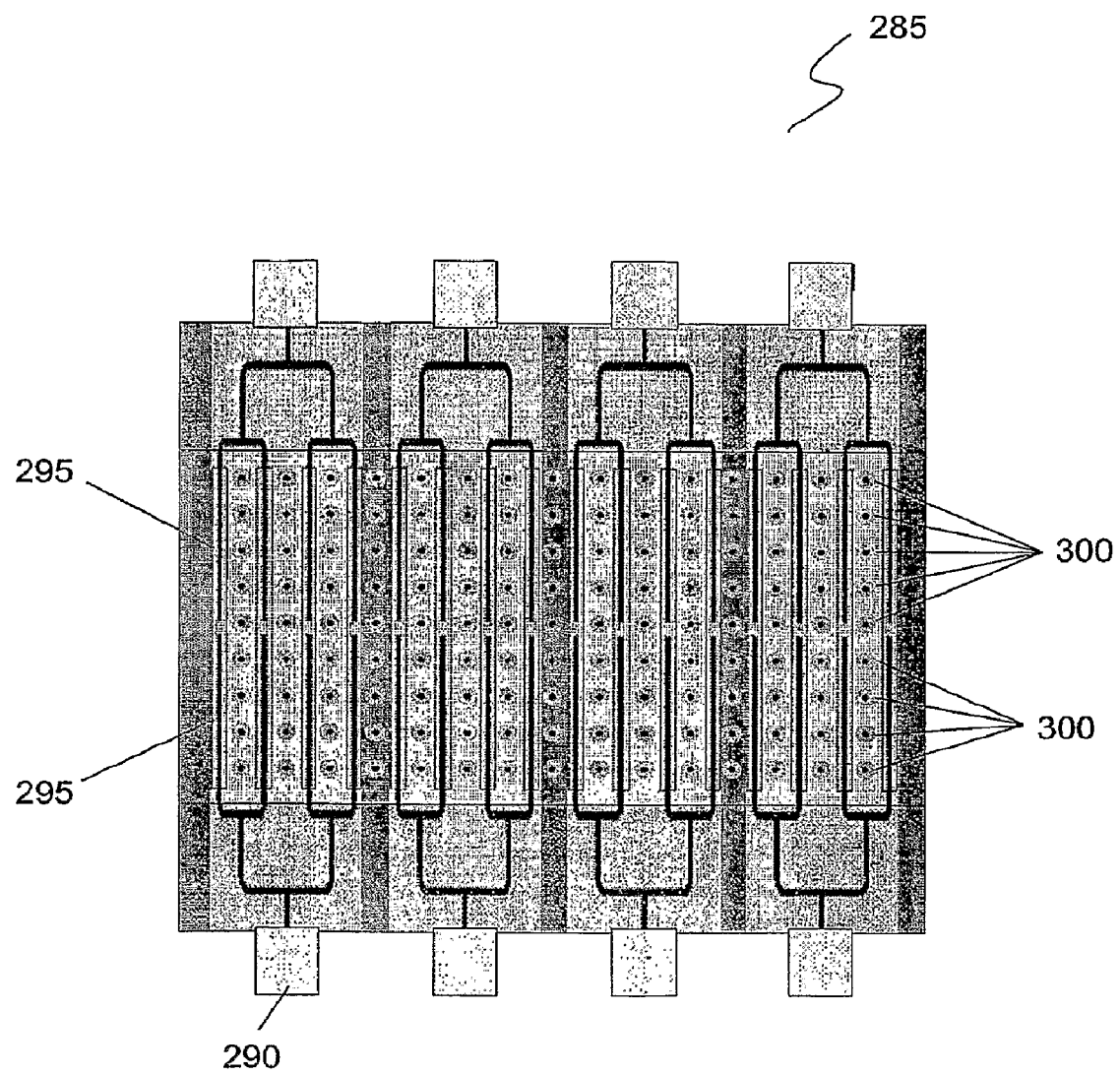
FIG. 8 illustrates a front view of a PECVD system that uses dual volume precursor drop tubes.

FIG. 8 illustrates a front view of a PECVD system 285 that uses dual volume precursor drop tubes. This embodiment includes power generators 290 connected to a series of split sources 295 and an array of dual volume drop tubes 300. In one embodiment each of these drop tubes can be individually controlled by an attached flow regulator. Alternatively groups of the drop tubes could be separately controllable by the flow regulator. Independent control permits localized control of film properties and greatly reduces edge effects.

Figure 9:
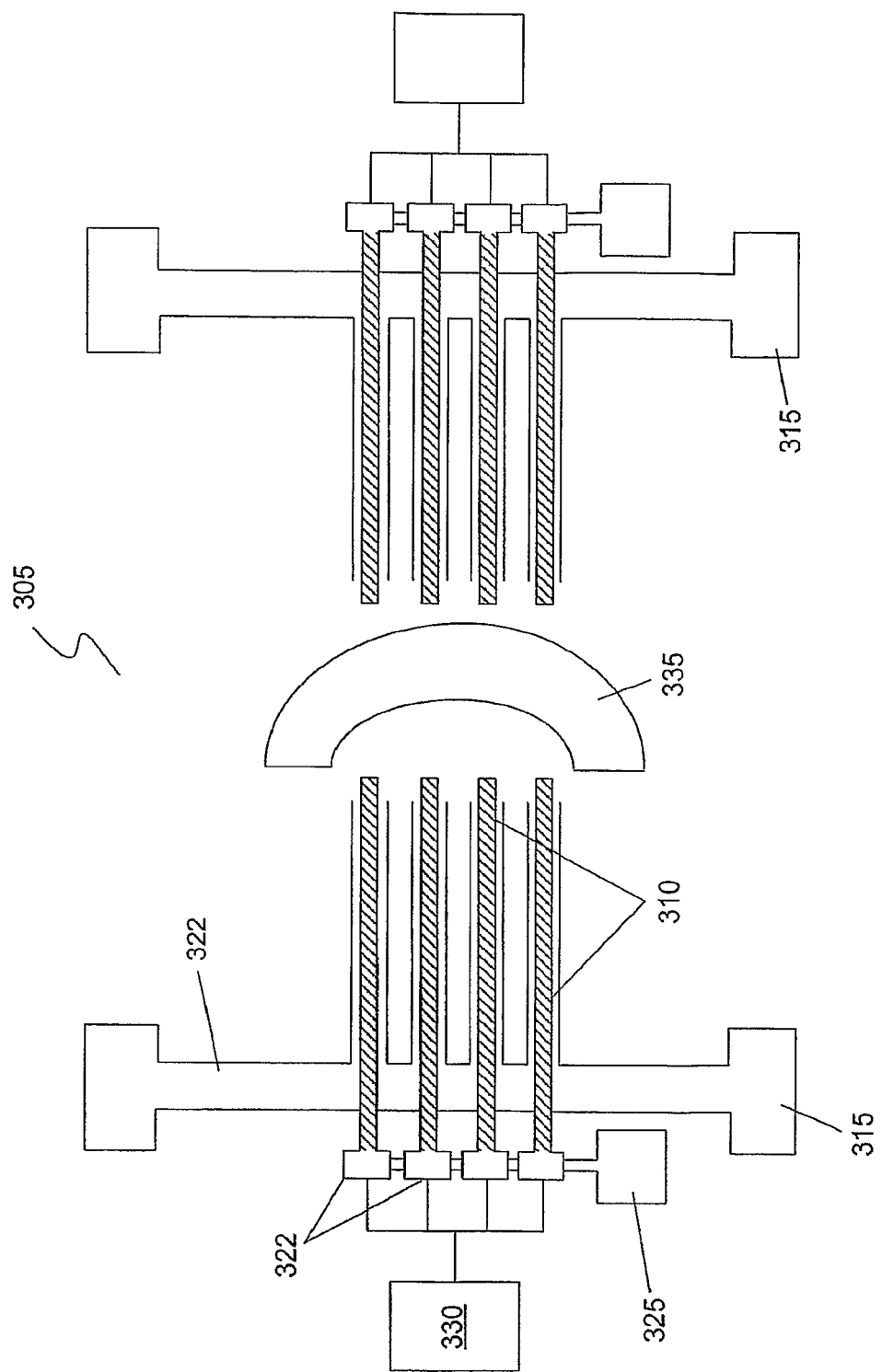
FIG. 9 illustrates another embodiment of a PECVD system that can be used for dual-side coating of curved or flat substrates.

FIG. 9 illustrates another embodiment of a PECVD system 305 that can be used for dual-side coating of curved or flat substrates. This system includes a plurality of dual-volume drop tubes, possibly, on both sides of a substrate. In this embodiment the dual volume drop tubes 310 have a staggered length. That is, one portion of the drop tube is a different length of the other portion of the drop tube. This variable length can be used to change pumping effects. Drop tubes can be used in conjunction with top-side pumping in some embodiments.

This PECVD system 305 includes a plurality of drop tubes 310, an exhaust pump 315, an exhaust 320 connected to the drop tubes 310 and exhaust pump 315, a series of flow regulators 322, a precursor gas supply 325, and a computer system 330 connected to the flow regulators. This embodiment also includes butterfly valves 366 to regulate the impact of the exhaust pump.

Figure 10:
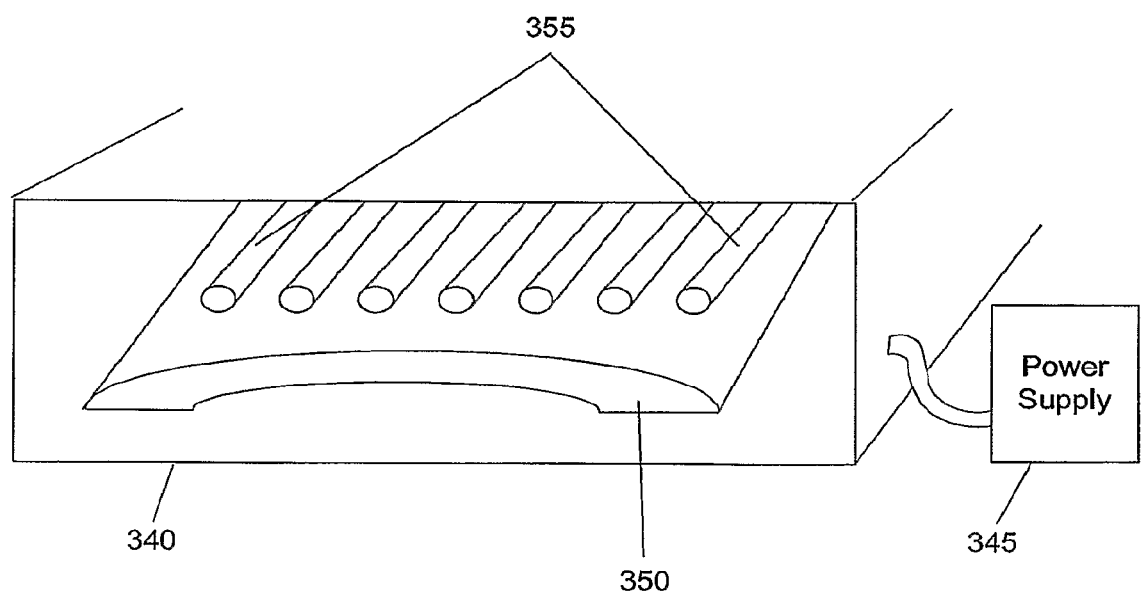
FIG. 10 illustrates another embodiment of a PECVD system with power contouring.
Figure 11:
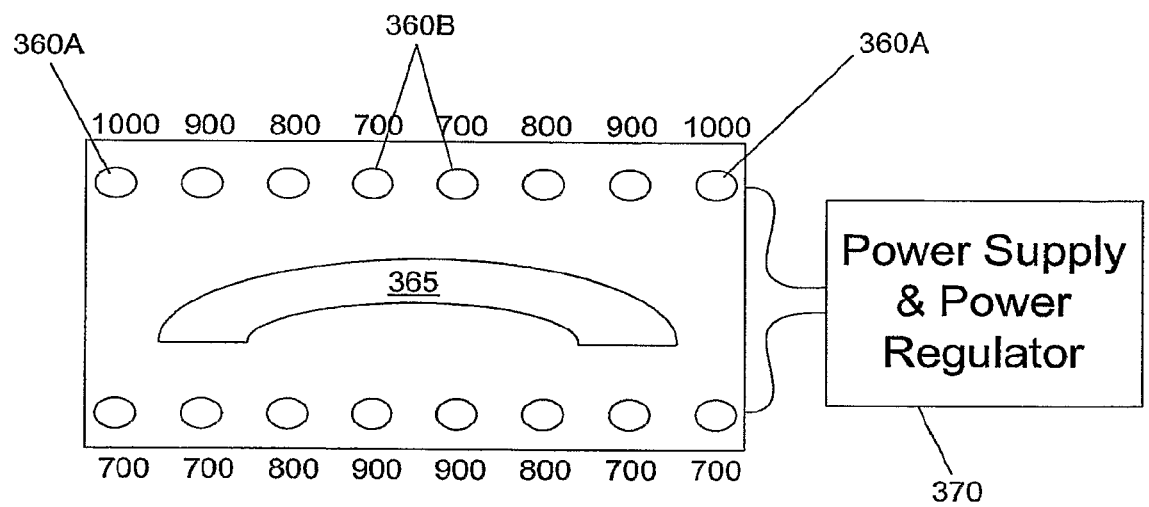
FIG. 11 illustrates another embodiment of a PECVD system with power contouring.

Referring now to FIGS. 10 and 11, they illustrate other embodiments of a PECVD system. In these embodiments, the gas supplies and pump are not shown, but those skilled in the art understand that the elements are present. The embodiment of FIG. 10 illustrates the process chamber 340, the power supply 345, a curved substrate 350, and an array of sources 355.

Referring to FIG. 11, the sources 360 are driven with different amounts of power. As previously discussed, the deposition rate and film chemistry can be altered by altering the power applied to a source. In typical systems, power is applied evenly across all sources in the array of sources. In this system however, the power is varied at each source based, for example, upon the source's distance from the surface of the substrate 365. For example, in this embodiment, sources 360A are operated at a higher power than are sources 360B because sources 360A are further from the substrate than are sources 360B.

This system also includes a power regulator 370 configured to vary the power applied at each source according to configurations set by the user. Accordingly, such a system could be rapidly reconfigurable to evenly coat any type of curved substrate. Similarly, this variable source power arrangement could be used to coat flat substrates and compensate for edge effects by applying, for example, less power to sources near the edges than is applied to sources in the center of the substrate.

The exact amount of power applied to individual sources will vary according to precursor-gas type, supporting-gas type, substrate type, desired film properties, vacuum chamber pressures, characteristics of particular coating machines, etc. Those of skill in the art can easily select power amounts to produce the desired type of film. Some experimentation will likely be necessary due the variances in coating machines and other characteristics.

This variable power embodiment could be utilized by itself or could be utilized in combination with the previously described precursor gas delivery system and excess gas pumping systems.

In conclusion, the present invention provides, among other things, a system and method for controlling a chemical vapor deposition process. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A vapor deposition system for depositing a film on a substrate, the system comprising:
   a vacuum chamber;
   a plurality of sources located inside the vacuum chamber; and
   a plurality of dual-volume drop tubes, each of the plurality of dual-volume drop tubes comprising a first volume for delivering precursor gas and a second volume for providing pumping.

2. The system of claim 1, further comprising:
   a flow regulator connected to at least one of the plurality of dual-volume drop tubes, the flow regulator configured to regulate the amount of precursor gas that flows into the first volume of the at least one of the plurality of dual-volume drop tubes.

3. The system of claim 1, further comprising:
   a pump connected to the second volume of at least one of the plurality of dual-volume drop tubes.

4. The system of claim 1, further comprising:
   a first flow regulator connected to a first of the plurality of dual-volume drop tubes, the first flow regulator configured to regulate the amount of precursor gas that flows into the first volume of the first of the plurality of dual-volume drop tubes; and
   a second flow regulator connected to a second of the plurality of dual-volume drop tubes, the second flow regulator configured to regulate the amount of precursor gas that flows into the first volume of the second the plurality of dual-volume drop tubes.

5. The system of claim 1, further comprising:
   a second flow regulator connected to the second volume of at least one of the plurality of gas tubes, the second flow regulator configured to regulate the amount of exhaust dual-volume drop that is pumped out of the second volume of the at least one of the plurality of dual-volume drop tubes.

6. The system of claim 4, further comprising:
   a computer in communication with the first flow regulator and the second flow regulator, the computer configured to adjust the first flow regulator and the second flow regulator to thereby adjust the amount of precursor gas that flows into the first volume of the first of the plurality of dual-volume drop tubes and into the first volume of the second of the plurality of dual-volume drop tubes.

7. The system of claim 1, wherein the plurality of sources is a first plurality of sources and the plurality of dual-volume drop tubes is a first plurality of dual-volume drop tubes and wherein the first plurality of sources and the first plurality of dual-volume drop tubes are positioned adjacent to a first side of the substrate, the system further comprising:
   a second plurality of sources located inside the vacuum chamber; and
   a second plurality of dual-volume drop tubes, each of the plurality of dual-volume drop tubes comprising a first volume for delivering precursor gas and a second volume for providing pumping;
   wherein the second plurality of sources and the second plurality of dual-volume drop tubes are positioned adjacent to a second side of the substrate.

8. The system of claim 1, further comprising:
a shield partially surrounding at least one of the plurality of sources; and
a carrier gas supply positioned inside the shield.

9. The system of claim 1, further comprising:
a plurality shields, each of the plurality of shields configured to partially surround a corresponding one of the plurality of sources;
a plurality of carrier gas sources, each of the plurality of carrier gas sources positioned inside a corresponding one of the plurality of shields;
a top-side pumping vent, and
a pump connected to the top-side pumping vent.

10. The system of claim 9, wherein the top-side pumping vent comprises:
a plurality of top-side pumping vents; and
a duct connecting the plurality of top-side vents.

* * * * *